United States Patent
Kuo et al.

(10) Patent No.: US 11,072,871 B2
(45) Date of Patent: Jul. 27, 2021

(54) PREPARATION APPARATUS FOR SILICON CARBIDE CRYSTALS COMPRISING A CIRCULAR CYLINDER, A DOPING TABLET, AND A PLATE

(71) Applicant: National Chung-Shan Institute of Science and Technology, Taoyuan (TW)

(72) Inventors: Chih-Wei Kuo, Hsinchu (TW); Dai-Liang Ma, Taoyuan (TW); Chia-Hung Tai, New Taipei (TW); Bang-Ying Yu, Taoyuan (TW); Cheng-Jung Ko, New Taipei (TW); Bo-Cheng Lin, Taoyuan (TW); Hsueh-I Chen, Taoyuan (TW)

(73) Assignee: National Chung-Shan Institute of Science and Technology, Taoyuan (TW)

( * ) Notice: Subject to any disclaimer, the term of this patent is extended or adjusted under 35 U.S.C. 154(b) by 0 days.

(21) Appl. No.: 16/721,935

(22) Filed: Dec. 20, 2019

(65) Prior Publication Data
US 2021/0189590 A1   Jun. 24, 2021

(51) Int. Cl.
| | |
|---|---|
| C30B 35/00 | (2006.01) |
| C30B 23/00 | (2006.01) |
| C30B 23/02 | (2006.01) |
| C23C 14/24 | (2006.01) |
| C23C 14/06 | (2006.01) |
| C30B 29/36 | (2006.01) |

(52) U.S. Cl.
CPC ........ C30B 23/005 (2013.01); C23C 14/0635 (2013.01); C23C 14/243 (2013.01); C30B 23/02 (2013.01); C30B 29/36 (2013.01)

(58) Field of Classification Search
CPC ..... C30B 23/00; C30B 23/002; C30B 23/005; C30B 23/02; C30B 29/00; C30B 29/10; C30B 29/36; C30B 35/00; C30B 35/002; C23C 14/06; C23C 14/0635; C23C 14/22; C23C 14/24; C23C 14/243
USPC ..... 117/84, 88, 99–100, 102, 109, 200, 204, 117/937, 951
See application file for complete search history.

(56) References Cited

U.S. PATENT DOCUMENTS

| | | | |
|---|---|---|---|
| 6,406,539 B1 * | 6/2002 | Shigeto | C30B 23/00 117/88 |
| 6,730,283 B2 * | 5/2004 | Konno | C01B 32/977 423/345 |
| 2008/0190355 A1 * | 8/2008 | Chen | H01L 29/1608 117/3 |

(Continued)

FOREIGN PATENT DOCUMENTS

| | | |
|---|---|---|
| CN | 203820924 U | 9/2014 |
| JP | 2001-509768 A | 7/2001 |
| JP | 2005-8472 A | 1/2005 |

(Continued)

*Primary Examiner* — Kenneth A Bratland, Jr.
(74) *Attorney, Agent, or Firm* — Winston Hsu

(57) ABSTRACT

A preparation apparatus for uniform silicon carbide crystals comprises a circular cylinder, a doping tablet, and a plate to stabilize and control the supply of dopants. The accessory does not participate in the reaction in the growth chamber but maintains its efficacy during growth. Finally, a single semi-insulating silicon carbide crystal with uniform electrical characteristics can be obtained.

10 Claims, 3 Drawing Sheets

(56) References Cited

U.S. PATENT DOCUMENTS

2014/0202389 A1* 7/2014 Heo .................. C30B 29/36
118/726

FOREIGN PATENT DOCUMENTS

| | | |
|---|---|---|
| JP | 2008-169111 A | 7/2008 |
| JP | 2008-538542 A | 10/2008 |
| JP | 2010-150133 A | 7/2010 |
| JP | 2012-30994 A | 2/2012 |
| JP | 2012-521948 A | 9/2012 |
| JP | 2012-201584 A | 10/2012 |
| JP | 2015-20938 A | 2/2015 |
| JP | 2016-56088 A | 4/2016 |
| WO | 2017/043411 A1 | 3/2017 |

* cited by examiner

PREPARATION APPARATUS FOR SILICON CARBIDE CRYSTALS COMPRISING A CIRCULAR CYLINDER, A DOPING TABLET, AND A PLATE

BACKGROUND OF THE INVENTION

1. Field of the Invention

The present invention relates to a preparation apparatus for uniform silicon carbide crystals, and more particularly, to a preparation apparatus for uniform silicon carbide crystals applied to a graphite crucible.

2. Description of the Prior Art

With the development of technology, high power density, small components and high frequency operations have become essential. However, the development of silicon seems to have reached its limit, such that the growth of component performance is limited by the material. Thus, there is a need to develop new materials to replace the material currently used in the industry to break through the bottleneck. The excellent properties of silicon carbide can meet the specifications that cannot be reached by silicon currently. For example, the energy gap, the breakdown electric field, and the saturation electron drift rate of silicon carbide are 3, 10, and 2 times higher than traditional silicon substrates, respectively. 4H and 6H silicon carbide single crystals are utilized as the materials of lattice-matched substrates in semiconductor devices. In the ultra-high-speed photoconductive switches and high-frequency related equipment, the silicon carbide substrate needs to be semi-insulated (i.e., high resistance) to avoid equipment breakdown. In general, "semi-insulated" means that the resistance of the single silicon carbide crystal is higher than $10^5$ ohm-cm.

At present, there are two main methods for preparing semi-insulating silicon carbide crystals, which are the generation of point defects and the contribution of dopants. U.S. Pat. No. 8,147,991 B2 discloses that without doping of deep energy gap compensation elements, by disposing of silicon carbide crystals, which are not reached semi-insulation at a high temperature of 2000-2400° C., rapidly cooling to 1200° C. by 30-150° C. per minute, and maintaining the point defects (Vc) existing in the silicon carbide crystal will make the silicon carbide crystal to be high resistant. However, rapid cooling at high temperatures is risky and may be accompanied by cracks and excessive internal stress in the crystal, causing degradation to yield and quality.

U.S. Pat. No. 5,611,955 discloses that applying vanadium or vanadium compounds as a dopant into the growth chamber may obtain a single semi-insulating silicon carbide crystal. However, because vanadium is in direct contact with the silicon carbide source, a complex chemical reaction occurs between vanadium and the silicon carbide source at high temperatures, causing a variety of intermediate compounds such as vanadium carbide, silicon compounds, carbon-silicide, etc. and causing the doping of vanadium to be not uniform.

U.S. Pat. No. 9,322,110 discloses using gaseous dopants to perform an experiment, which mainly uses vanadium chloride (VClx) as a dopant, wherein a carrier gas is used to pass through the vanadium chloride bath to bring in the vanadium chloride vapor, and then doped into the growing silicon carbide crystal. Although the gaseous dopant can stably control the doping dose, it generates byproduct halogen gas (Cl2) and hydrochloric acid (HCl), which pollute the environment, hurt human health, and impact mechanical maintenance.

A physical vapor transport (PVT) method is utilized for the crystal growth of silicon carbide crystal, wherein the temperature for crystal growth is from 2000 to 2400° C., the pressure is 0.1-50 torr, and the growth rate generally falls to 100-250 μm/hr. The production materials are expensive and need a long time to grow. Therefore, it is important to increase yield; that is, it is necessary to stably produce a semi-insulating silicon carbide crystal with uniform electrical characteristics in fixed growth time.

SUMMARY OF THE INVENTION

It is therefore a primary objective of the present invention to provide a preparation apparatus for uniform silicon carbide crystals, to improve over disadvantages of the prior art. The present invention discloses a preparation apparatus for uniform silicon carbide crystals to stabilize and control the supply of dopants; the accessory does not participate in the reaction in the growth chamber but maintains its efficacy during growth. Finally, a single semi-insulating silicon carbide crystal with uniform electrical characteristics can be obtained.

To achieve the goal in above, an embodiment of the present invention discloses a preparation apparatus for uniform silicon carbide crystals, comprising a circular cylinder, wherein a surface of the circular cylinder is a heat-resistant anticorrosion material, and a bottom of the circular cylinder comprises a first cluster of plural pores; a doping tablet, compressed with a dopant and an excipient, wherein the doping tablet is disposed on an interior of the circular cylinder and contacted to the first cluster of plural pores; and a plate, wherein a surface of the plate is a heat-resistant anticorrosion material, disposed on a top of the doping tablet, comprising a second cluster of plural pores contacted to the doping tablet, and a plural of distribution locations of the second cluster of plural pores being the same as the first cluster of plural pores.

The present invention also discloses a preparation apparatus for uniform silicon carbide crystals of claim 1, wherein a plurality of pore diameters of the first cluster of plural pores and the second cluster of plural pores are from 1 to 10 mm.

The present invention also discloses a preparation apparatus for uniform silicon carbide crystals, wherein a thickness of the plate is from 1 to 10 mm.

The present invention also discloses a preparation apparatus for uniform silicon carbide crystals, wherein the dopant is a vanadium compound and the excipient is an expanded graphite powder.

The present invention also discloses a preparation apparatus for uniform silicon carbide crystals of, wherein a height of the circular cylinder is from 20 to 200 mm.

The present invention also discloses a preparation apparatus for uniform silicon carbide crystals of, wherein the heat-resistant anticorrosion material is tantalum carbide (TaC) or niobium carbide (NbC).

The present invention also discloses a preparation apparatus for uniform silicon carbide crystals of, wherein the vanadium compound is vanadium carbide or vanadium pentoxide.

An embodiment of the present invention also discloses a graphite crucible, comprising a crucible body, which is a boiler in a graphite material, wherein an interior wall of the crucible body has two terminals: a first terminal and a second terminal; a seed, disposed on the first terminal; a preparation apparatus for uniform silicon carbide crystals, disposed on the interior wall of the crucible body, comprising: a circular cylinder, a doping tablet, and a plate, wherein a surface of the circular cylinder is a heat-resistant anticorrosion material, and a bottom of the circular cylinder comprises a first cluster of plural pores; the doping tablet, compressed with a vanadium compound and an expanded graphite powder, is disposed on an interior of the circular cylinder and contacted to the first cluster of plural pores, and a surface of the plate is a heat-resistant anticorrosion material, the plate, disposed on a top of the doping tablet, comprising a second cluster of plural pores contacted to the doping tablet, and a plural of distribution locations of the second cluster of plural pores being the same as the first cluster of plural pores; and a silicon carbide source, disposed on the second terminal.

The present invention also discloses a graphite crucible, wherein the heat-resistant anticorrosion material is tantalum carbide (TaC) or niobium carbide (NbC).

The present invention also discloses a graphite crucible, wherein, the vanadium compound is vanadium carbide which is vanadium pentoxide.

In order to make the objects, technical solutions and advantages of the present invention become more apparent, the following relies on the accompanying drawings and embodiments to describe the present invention in further detail.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
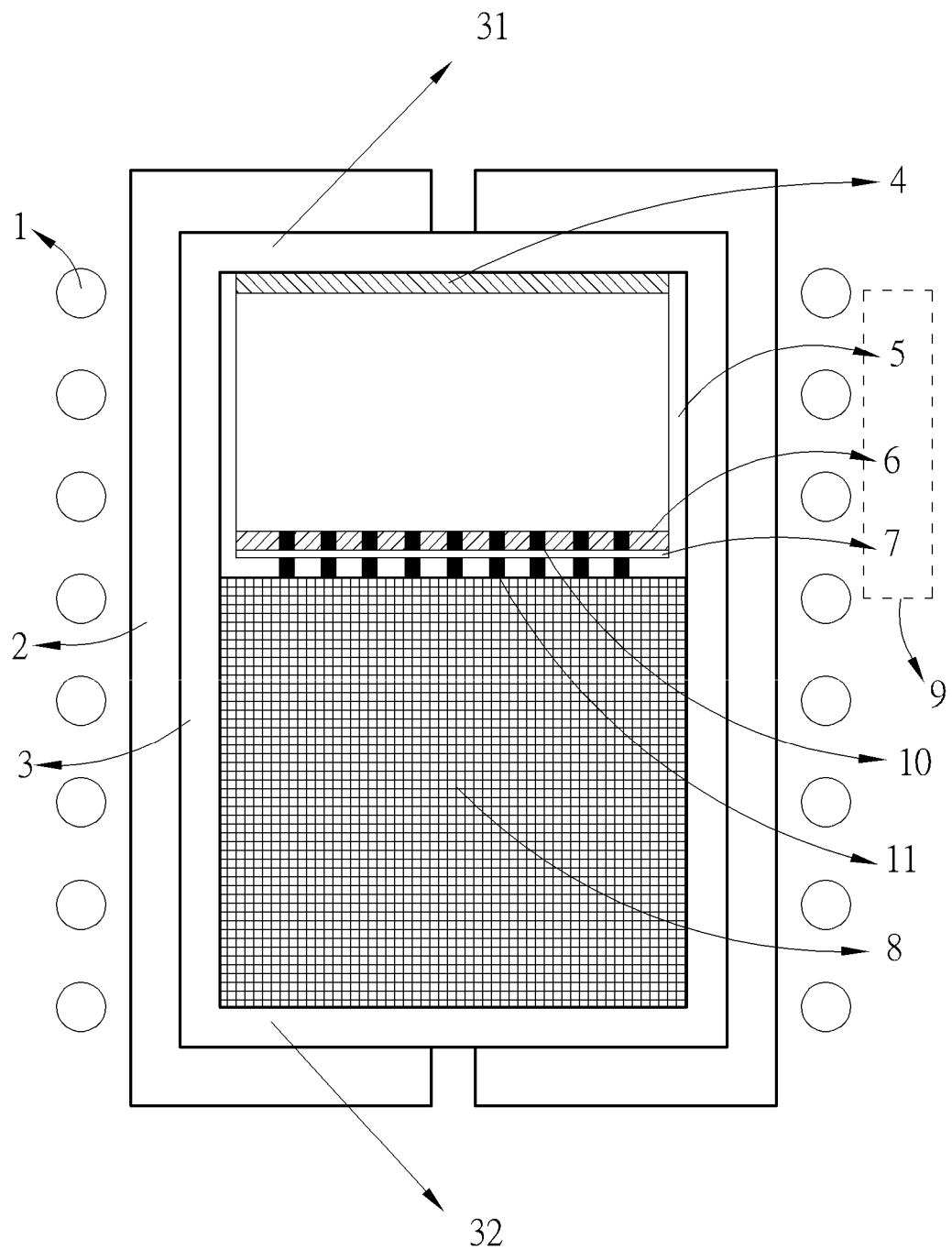
FIG. 1 is a schematic diagram of a graphite crucible according to an embodiment of the present invention.

The embodiments stated below are utilized for illustrating the concept of the present application. Those skilled in the art can easily understand the advantages and effects of the present invention disclosed by the application.

A physical vapor transport (PVT) method is utilized for the crystal growth of silicon carbide crystal, wherein the temperature for crystal growth is from 2000 to 2400° C., the pressure is 0.1-50 torr, and the growth rate generally falls to 100-250 µm/hr. The production materials are expensive and need a long time to grow. Therefore, it is important to increase yield; that is, it is necessary to stably produce a semi-insulating silicon carbide crystal with uniform electrical characteristics in fixed growth time. The present invention utilizes an internal accessory of graphite crucible to stabilize and control the supply of dopants; the accessory does not participate in the reaction in the growth chamber but maintains its efficacy during growth. Finally, a single semi-insulating silicon carbide crystal with uniform electrical characteristics can be obtained.

The tantalum carbide has superior physical characteristics such as high wear resistance, chemical resistance, and heat-resistant, and therefore, the present invention utilizes the tantalum carbide as materials for manufacturing the accessory (i.e., the preparation apparatus for uniform silicon carbide crystals), which is not limited herein. Preferably, the materials of preparation apparatus for uniform silicon carbide crystals may be tantalum carbide (TaC), niobium carbide (NbC), or other materials that can withstand temperatures above 2000° C. with corrosion resistance under vacuum or inert gas. To achieve the uniform electrical characteristics, the dopant in the reaction pathway must be uniformly and quantitatively. In other words, it is important to control the cross-section area provided by the dopant and to control the escape rate in the growth chamber. The present invention utilizes the doping tablet compressed by vanadium compound and expanded graphite powder, wherein the vanadium compound may be vanadium carbide, vanadium pentoxide, or other vanadium compounds, and the expanded graphite powder may be replaced by other substances that are not consumed in the reaction and do not affect the electrical characteristics.

Please refer to FIG. 1 to FIG. 4, which are schematic diagrams of a graphite crucible and a preparation apparatus for uniform silicon carbide crystals according to an embodiment of the present invention. To solve the problems in the prior art, an embodiment of the present invention discloses a graphite crucible disposing to a device. In an embodiment of the present invention, a proposed method uses the physical vapor transfer method for the crystal growth of the silicon carbide, which comprises: firstly preparing a silicon carbide crystal as an seed 4, disposing the seed 4 on a top of a crucible body 3, wherein an interior wall of the crucible body 3 comprises a first terminal 31 and a second terminal 32. In other words, the seed 4 is disposed on the first terminal 31, and the bottom of the crucible is filled with a silicon carbide source 8; that is, the silicon carbide source 8 is disposed on the second terminal 32, by adjusting the thermal insulation materials 2 or heating source 1, to achieve appropriate temperature gradient, and then, the seed 4 starts to grow. The space between the seed and the silicon carbide source may be called growth chamber, and the reaction is very complex and harsh in this region, but it is the essential pathway for silicon carbide source to sublimate to seed crystallization, and the dopant, therefore, is appropriate to be put up here.

Figure 2:
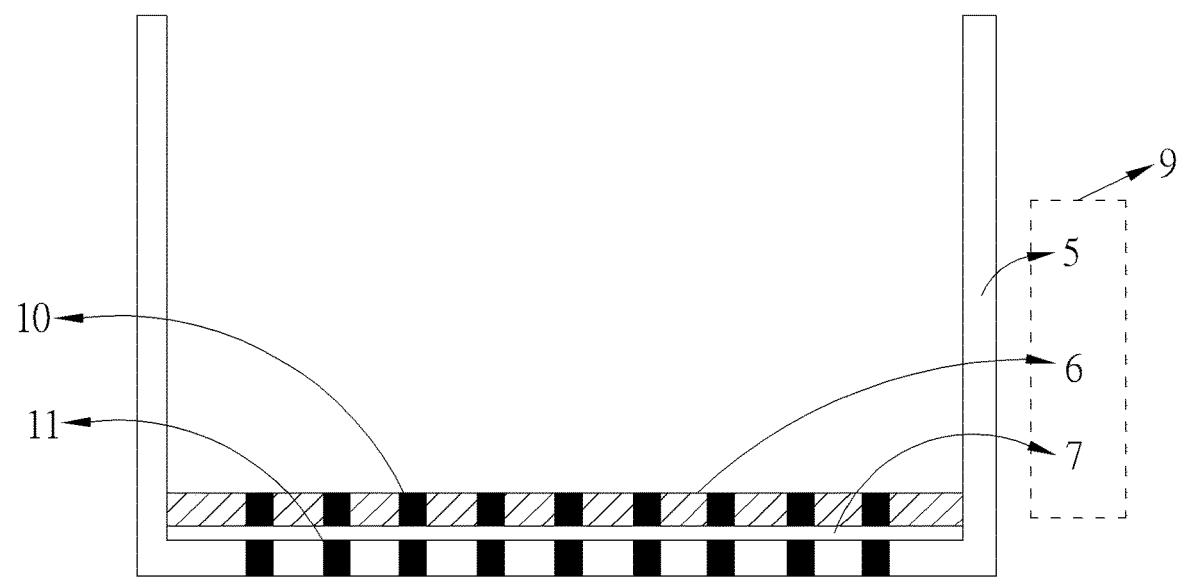
FIG. 2 is a schematic diagram of a preparation apparatus for uniform silicon carbide crystals according to an embodiment of the present invention.
Figure 3:
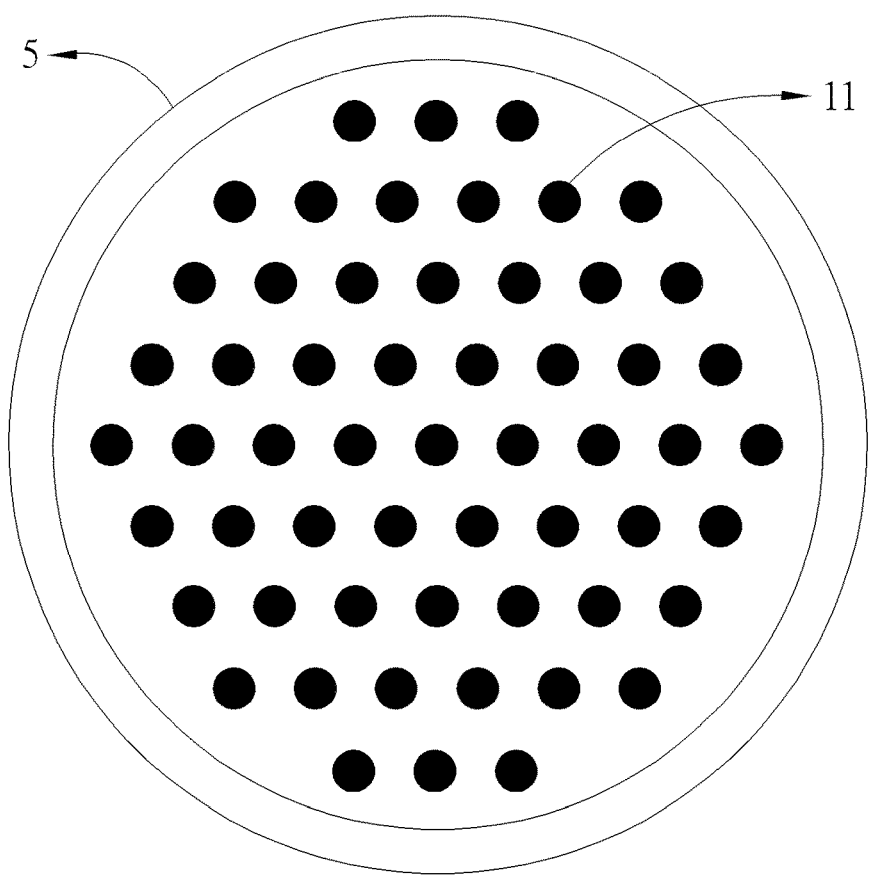
FIG. 3 is a schematic diagram of a circular cylinder according to an embodiment of the present invention.
Figure 4:
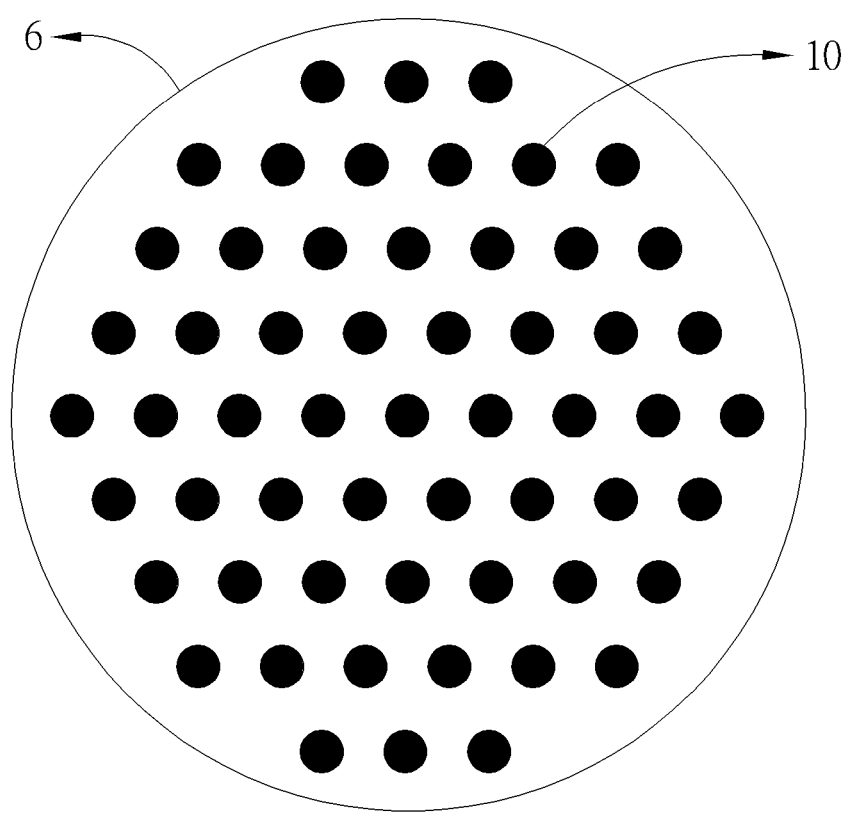
FIG. 4 is a schematic diagram of a plate according to an embodiment of the present invention.

An embodiment of the present invention discloses a device 9, providing the crystal growth of uniform semi-insulating silicon carbide. As shown in FIG. 2, the device consists of a circular cylinder 5 and a plate 6 which may be disposed inside the circular cylinder 5. A doping tablet 7 is disposed in the space between the circular cylinder 5 and the plate 6. The circular cylinder 5 and the plate 6 are protected by tantalum carbide; that is, the surfaces of the circular cylinder 5 and the plate 6 are tantalum carbide. Preferably, the circular cylinder 5 and the plate 6 may be plated to replace the materials of the surface by tantalum carbide or niobium carbide, and the circular cylinder 5 and the plate 6 are not limited to a single piece of tantalum carbide or niobium carbide, which, as shown in FIG. 3 and FIG. 4, may comprise a first cluster pores 11 and a second cluster pores 10 corresponded to each other, where the dopant 7 adding ratio is about 0.01-1 wt % of the weight of the silicon carbide source 8. Too little dopant may cause the single silicon carbide crystal to be incapable of reaching high resistance, while too much dopant may cause the precipitation of vanadium and the degradation of the quality of the single crystal. The doping tablet 7 comprises the dopant and excipient by compressed with the dopant and the excipient, wherein the dopant may be the vanadium compound, and the excipient may be the expanded graphite powder. By fixing the dopant to be a tablet with the excipient, the dopant tablet may be disposed in the space between the circular cylinder 5 and the plate 6 without falling to the surface of the silicon carbide source 8.

An embodiment of the present invention discloses a preparation apparatus for uniform silicon carbide crystals, the diameter of the pores of the first cluster of plural pores and the second cluster of plural pores may be from 1 to 10 mm, and the pores are preferably circular for the issue of uniformly controlling doping flow and the difficulty of device processing. The size of the pores must be appropriate, i.e., too small pores cause the dopant escapes difficultly, too large pores cause the fast escape so that the dopant consumed out when the stage of formal crystal growth stage, which causes that the crystal fails to reach the high resistance in the later stage. The first cluster of plural pores and the second cluster of plural pores may be a uniform distribution or a local distribution fitting the model for the thermal field.

An embodiment of the present invention discloses a preparation apparatus for uniform silicon carbide crystals, wherein the thickness of the plate may be from 1 to 10 mm. Too small thickness of the plate may cause that it is not easy to process for the plate, which breaks easily. Too large thickness of the plate may cause the issue of pores blockage for the dopant escape due to increase of the pore intervals. The height of the circular cylinder may be 20-200 mm, mainly limited to the size of the graphite crucible, within a half of the height of the graphite crucible, which is usually about 300 mm. The height of the circular cylinder cannot be too large due to the pressure drop, because it needs to maintain the low-pressure environment when the silicon carbide grows, and the graphite contains the pores to make the pressure decreased to the growth pressure in the crucible. Suppose that the circular cylinder is too long, the compactness of tantalum carbide causes that the gas inside the crucible cannot be ejected, which further causes that the procedure of silicon carbide crystal growth cannot proceed.

An embodiment of the present invention discloses a circular cylinder made of tantalum, machined with the 50 mm high, 100 mm inner diameter, 2 mm thickness, and the pores of 1 mm diameter, which are 126 pores uniformly distributed on the plane. For the inner diameter of the circular cylinder, the plate is machined therein the 2 mm thickness and 100 mm outer diameter, and the number and size of the pores on the plate is equal to the number and size of pores of the circular cylinder. With disposing the circular cylinder and the plate to the graphite crucible, firstly transforming $Ta_2O_5$ of the surface to TaC then disposing the doping tablet, uniformly compressed with 6 g vanadium carbide (VC, 3N) and 10 g expanded graphite powder with a diameter of 100 mm, into it, wherein VC is the chemical formula of vanadium carbide, and 3N is 99.9% pure, then a device is produced for the crystal growth of uniform semi-insulating silicon carbide. Disposing the device into the graphite crucible for pre-growth silicon carbide crystals to perform the crystal growth process of silicon carbide at growth temperature of 2200° C., at pressure of 5 torr, the temperature gradient of 45° C., and the growth period is 50 hours, to obtain a single 4H silicon carbide crystal with thickness 7.5 mm, and diameter 4 inches.

Wafer dicing is performed to the grown silicon carbide crystals in the above embodiment by wire machining to obtain the wafer of 4-inch 4H silicon carbide with 700 μm thickness. The damage of the surface of the wafer will affect the resistance measurement when using COREMA; therefore, the wafer of silicon carbide needs to be ground on the copper disc with the 15-μm, 9-μm, 6-μm, 3-μm, and 1-μm diamond slurry sequentially, and eventually the wafer is polished on the polishing cloth with 1-μm diamond slurry, and then the wafer of silicon carbide could be obtained. Measuring the resistance by COREMA, it can find that all the resistivity of the whole wafer are at least $10^{10}$ ohm-cm, where the order of magnitude difference between the maximum ($4.4 \times 10^{11}$ ohm-cm) and the minimum ($4.5 \times 10^{10}$ ohm-cm) is less than 1, i.e., the resistivity and uniformity is very well.

The present invention discloses an apparatus for the crystal growth of uniform semi-insulating silicon carbide, which may control the doping concentration uniformly at a single silicon carbide crystal. By disposing an apparatus, protected by tantalum carbide, in the space between silicon carbide seed and silicon carbide source, the cleanness in the growth chamber may be maintained, where the cross-section of the apparatus corresponds to the size of the seed and the dopant can be stabilized in the reaction and uniformly provided, and eventually a single uniform silicon carbide crystal may be obtained. Moreover, except the effect of the parallel plane apparatus, the longitudinal plane also plays a role in controlling the doping concentration, this is because the graphite is a porous material, where the open porosity of graphite in high density is still 8%-12%; therefore, when the dopant starts to provide to the silicon carbide seed, there is an issue of difficulty dopant quantitative and doping not in uniform due to escaping of the dopant from the growth chamber via the pores on the graphite. Compared with graphite, tantalum carbide contains physical characteristics such as high density and low porosity, which can prevent the dopant from escaping from the growth chamber, and achieve the effect of dopant quantitative.

The foregoing is only embodiments of the present application, which is not intended to limit the present application. Those skilled in the art may make modifications and alterations accordingly and not limited herein. Therefore, the scope of the present invention should be as listed in the scope of the claims mentioned below.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A preparation apparatus for silicon carbide crystals, comprising:
   a circular cylinder, wherein a surface of the circular cylinder is a metal carbide material, and a bottom of the circular cylinder comprises a first cluster of plural pores, and wherein each of the first cluster of plural pores penetrates through the bottom of the circular cylinder;
   a doping tablet, comprising a dopant and an excipient, wherein the doping tablet is disposed on an interior of the circular cylinder and contacted to the first cluster of plural pores; and
   a plate, wherein a surface of the plate is a metal carbide material, disposed on a top of the doping tablet, comprising a second cluster of plural pores contacted to the doping tablet, and a plural of distribution locations of the second cluster of plural pores being the same as the first cluster of plural pores.

2. The preparation apparatus for silicon carbide crystals of claim 1, wherein a plurality of pore diameters of the first cluster of plural pores and the second cluster of plural pores are from 1 to 10 mm.

3. The preparation apparatus for silicon carbide crystals of claim 1, wherein a thickness of the plate is from 1 to 10 mm.

4. The preparation apparatus for silicon carbide crystals of claim 1, wherein the dopant is a vanadium compound and the excipient is an expanded graphite powder.

5. The preparation apparatus for silicon carbide crystals of claim 1, wherein a height of the circular cylinder is from 20 to 200 mm.

6. The preparation apparatus for silicon carbide crystals of claim 1, wherein the metal carbide material is tantalum carbide (TaC) or niobium carbide (NbC).

7. The preparation apparatus for silicon carbide crystals of claim 4, wherein the vanadium compound is vanadium carbide or vanadium pentoxide.

8. A graphite crucible, comprising:
a crucible body, which is made of a graphite material, wherein an interior wall of the crucible body has two terminals: a first terminal and a second terminal;
a seed, disposed on the first terminal;
a preparation apparatus for silicon carbide crystals, disposed on the interior wall of the crucible body, comprising: a circular cylinder, a doping tablet, and a plate, wherein a surface of the circular cylinder is a metal carbide material, and a bottom of the circular cylinder comprises a first cluster of plural pores, and wherein each of the first cluster of plural pores penetrates through the bottom of the circular cylinder; the doping tablet, comprising a vanadium compound and an expanded graphite powder, is disposed on an interior of the circular cylinder and contacted to the first cluster of plural pores, and a surface of the plate is a metal carbide material, the plate, disposed on a top of the doping tablet, comprising a second cluster of plural pores contacted to the doping tablet, and a plural of distribution locations of the second cluster of plural pores being the same as the first cluster of plural pores; and
a silicon carbide source, disposed on the second terminal.

9. The graphite crucible of claim 8, wherein the metal carbide material is tantalum carbide (TaC) or niobium carbide (NbC).

10. The graphite crucible of claim 8, wherein, the vanadium compound is vanadium carbide or vanadium pentoxide.

* * * * *